(12) United States Patent
Jeon et al.

(10) Patent No.: US 6,489,652 B1
(45) Date of Patent: *Dec. 3, 2002

(54) TRENCH DMOS DEVICE HAVING A HIGH BREAKDOWN RESISTANCE

(75) Inventors: Chang-Ki Jeon, Kyungki-do (KR); Young-Soo Jang, Kyungki-do (KR)

(73) Assignee: Fairchild Semiconductor Corporation, South Portland, ME (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/742,754

(22) Filed: Nov. 1, 1996

(30) Foreign Application Priority Data

Nov. 11, 1995 (KR) .......................... 95-40870

(51) Int. Cl.⁷ ............................... H01L 29/76
(52) U.S. Cl. ...................... 257/330; 257/333
(58) Field of Search ............... 257/328–342; 438/270, 272, 274

(56) References Cited

U.S. PATENT DOCUMENTS

| | | | | | |
|---|---|---|---|---|---|
| 4,673,962 A | * | 6/1987 | Chaterjee et al. | ........... | 257/302 |
| 5,021,355 A | * | 6/1991 | Dhong et al. | ............... | 438/270 |
| 5,109,259 A | * | 4/1992 | Banerjee | ................... | 357/23.6 |
| 5,126,807 A | * | 6/1992 | Baba et al. | ................. | 257/401 |
| 5,250,450 A | * | 10/1993 | Lee et al. | .................... | 437/40 |
| 5,486,714 A | * | 1/1996 | Hong | ......................... | 257/321 |
| 5,578,508 A | * | 11/1996 | Baba et al. | ................. | 438/270 |
| 5,696,459 A | * | 12/1997 | Neugebauer et al. | ....... | 327/108 |
| 5,723,376 A | * | 3/1998 | Takeuchi et al. | ............ | 438/270 |
| 5,918,115 A | * | 6/1999 | Kikuchi et al. | ............. | 438/206 |
| 6,078,487 A | * | 6/2000 | Partovi et al. | ................ | 361/56 |

FOREIGN PATENT DOCUMENTS

| | | | | | |
|---|---|---|---|---|---|
| JP | 1-192174 | * | 8/1989 | ................. | 257/331 |
| JP | 402051279 | * | 2/1990 | ................. | 257/333 |
| JP | 5-48090 | * | 2/1993 | ................. | 257/330 |

* cited by examiner

*Primary Examiner*—Tom Thomas
*Assistant Examiner*—Ori Nadav
(74) *Attorney, Agent, or Firm*—Townsend and Townsend and Crew LLP

(57) ABSTRACT

A trench DMOS device having improved breakdown characteristics. The trench DMOS device has a gate oxide layer which has a substantially flattened thick portion in the bottom of the trench and which is relatively thinner on the sidewalls. In greater detail, the trench DMOS device comprises a trench formed in a semiconductor substrate, said trench having sidewalls and a bottom, a gate polysilicon layer filled into said trench, and a gate oxide layer formed between said gate polysilicon layer and the sidewalls and bottom of said trench, wherein a bottom part of said gate oxide layer has a thickness greater than both sidewall parts thereof, and a central region of said bottom part is substantially flattened with a thickness greater than boundary regions thereof. Also disclosed is a novel method of fabricating a trench DMOS device.

8 Claims, 7 Drawing Sheets

Prior Art

Prior Art

TRENCH DMOS DEVICE HAVING A HIGH BREAKDOWN RESISTANCE

FIELD OF THE INVENTION

The present invention relates to a trench DMOS (double-diffused metal oxide semiconductor) device.

DESCRIPTION OF PRIOR ART

Conventionally, a trench DMOS transistor comprises, as shown in FIG. 1, a trench passing through a body layer 11 formed over an n-type semiconductor substrate 10, said body layer 11 being formed of a p-type diffused region and a more heavily doped p$^+$ region, a gate oxide layer 24 formed on the sidewalls and bottom of the trench, a gate polysilicon layer 26 formed over said gate oxide layer 24 in the trench, and an n$^+$-type source impurity layer 28 formed on both side surfaces of the gate polysilicon layer 26 and partially at the top surface of the body layer 11.

In such trench DMOS transistors, the drain terminal is connected to the semiconductor substrate 10, the source terminal is connected to the source impurity layers 28 and the body layer 11, and the gate terminal is connected to the polysilicon layer 26 in the trench. The semiconductor substrate 10 comprises a heavily doped n$^+$-type silicon substrate 10a covered with a low doped n-type covering layer 10b. During operation of the device, two channels are formed along the interface surfaces between the gate oxide layer 24 and the body layer 11.

Such conventional DMOS transistors may suffer a breakdown phenomenon which occurs in the junction between the heavily doped region of the body layer 11 and the low doped covering layer 10b, or between the gate oxide layer 24 and the low doped covering layer 10b when the transistor is reverse-biased. The latter case may be recoverable, but the former case is not, so there is a problem with the reliability of a device fabricated in this manner. In order to resolve this problem, U.S. Pat. No. 5,298,442, incorporated by reference herein, proposes that the junction between the heavily doped region of the diffused layer (i.e. the body layer) 11 and the low doped covering layer 10b be formed below the trench so that the breakdown may occur through the gate oxide layer 24 to the heavily doped region 11.

U.S. Pat. No. 4,992,390, incorporated by reference herein, proposes that the bottom of the gate oxide layer 24 be formed more thickly in order to prevent a breakdown in the gate oxide layer 24. This process and structure are described below with reference to FIGS. 2A to 2D.

Referring to FIG. 2A, a first oxide layer 12, a nitride layer 14, and a second oxide layer 16 are sequentially formed on a semiconductor substrate 10. A patterned photoresist 18 is formed on the second oxide layer 16 to define a trench forming region. As shown in FIG. 2B, an etching process is performed using the patterned photoresist 18 as a trench forming mask. Thus, the laminated layers on the substrate 10 are sequentially removed by the etching process, and a portion of the substrate 10 is selectively removed to form the trench 19. Oxygen ion implantation is performed to implant oxygen ions in the bottom of the trench 19.

Thereafter, an oxidation process is carried out to form the gate oxide layer 24 on the sidewalls and bottom of the trench, as shown in FIG. 2C. In this case, the gate oxide layer 24 is formed more thickly on the bottom of the trench than on the sidewalls because of the previous oxygen ion implantation. Removal of the nitride layer 14 and the second oxide layer 16 results in the structure shown in FIG. 2D. Hence, the above described breakdown is prevented from occurring in the region between the gate oxide layer 24 and the semiconductor substrate 10.

Another conventional means for preventing breakdown is described in U.S. Pat. No. 5,298,442, incorporated by reference herein, and is described below with reference to FIGS. 3A to 3F. In FIG. 3A, a first oxide layer 12, a nitride layer 14 and second oxide layer 16 are sequentially formed on a semiconductor substrate 10. A patterned photoresist 18 is formed on the second oxide layer 16 by means of a well-known photo process to define the trench forming region. An etching process is carried out by using the patterned photoresist 18 as a trench forming mask to remove the layers to form the trench 19, as shown in FIG. 3B. After removal of the patterned photoresist 18, a nitride layer 20 is deposited on the sidewalls and bottom of the trench 19 and on the second oxide layer 16, as shown in FIG. 3C. A third oxide layer 22 is formed over the nitride layer 20 by means of thermal oxidation.

As shown in FIG. 3D, a reactive ion etching process is performed on the oxide layer 22 to form spacers 22a on the sidewalls of the trench 19. The spacers 22a are used as a mask for removing the exposed nitride layer 20 on the second oxide layer 16 and exposed at the bottom of the trench 19. This is followed by an oxidation process to produce a thick oxide layer 24 in the region defined by the spacers 22a, as shown in FIG. 3E. Finally, the spacers 22a and the nitride layers 14 and 20 are all removed. This is followed by an oxidation process to produce the gate oxide layer 24a with the bottom region being thicker than the sidewalls, as shown in FIG. 3F. Hence, breakdown is prevented from occurring in the thick bottom region 24a shown in FIG. 3F.

The prior art described above suffers from several drawbacks. In FIG. 2D, the gate oxide layer 28 with a consistent thickness through the bottom region may not prevent the breakdown which frequently occurs in the central portion of the bottom region. In FIG. 3F, the gate oxide layer 24a with the bottom region gradually sloped from the central portion to the boundary portions may degrade the silicon interface characteristics because it is formed by using a dry etching process to produce the oxide spacers 22a on the sidewalls of the trench, as shown in FIG. 3E. In addition, the whole process is complicated due to the additional processing steps of forming and removing the oxide spacers 22a.

SUMMARY OF THE INVENTION

It is an object of the present invention to provide a method of fabricating a trench DMOS device which prevents the breakdown from occurring in the central portion of the bottom of the gate oxide layer, and to simplify the fabrication process for producing such a device.

It is another object of the present invention to provide a trench DMOS device or a trench semiconductor device with a gate oxide layer having an improved structure.

According to an embodiment of the present invention, a trench DMOS device comprises a trench formed in a semiconductor substrate, a gate polysilicon layer formed in said trench, and a gate oxide layer formed between said gate polysilicon layer and the sidewalls and bottom of said trench, wherein a bottom part of said gate oxide layer has a thickness greater than the sidewall parts thereof, and a central region of said bottom part is substantially flattened with a thickness greater than the boundary regions thereof.

According to another embodiment of the present invention, there is provided a method of fabricating a trench DMOS device, which comprises the steps of forming a trench by selectively etching a semiconductor substrate, said trench having sidewalls and bottom; forming a thermal oxide layer on the sidewalls and bottom; filling a polysilicon layer into said trench; wet-etching said thermal oxide layer between said polysilicon layer and said sidewalls from the top of said trench to a point surpassing the bottom of said polysilicon layer, said thermal oxide layer comprising a bottom part of having a thickness greater than each of sidewall parts, and said bottom part comprising a central region having a thickness greater than each of boundary regions thereof; and performing, after removal of said polysilicon layer, a thermal oxidation to form a relatively thin oxide layer on said thermal oxide layer on said sidewalls of said trench and on a top surface of said semiconductor substrate, said thermal oxide layer and said relatively thin oxide layer constituting a gate oxide layer.

In this embodiment, the step of forming said trench comprises the steps of sequentially forming a first oxide layer, a nitride layer and a second oxide layer on said semiconductor substrate, forming a photoresist pattern on said second oxide layer to define a trench forming region, and sequentially etching the layers on said semiconductor substrate and a portion of said semiconductor substrate by using said photoresist pattern as a trench forming mask to form said trench.

In this embodiment, the step of forming said thermal oxide layer comprises the step of removing said second oxide layer, and subjecting said semiconductor substrate to a thermal oxidation process to form a relatively thick thermal oxide layer on said first oxide layer on the sidewalls and bottom of said trench. The method of fabricating the DMOS device further comprises the step of polishing said semiconductor substrate until a top surface of said first oxide layer is exposed.

According to a further embodiment of the present invention, there is also provided a method of fabricating a trench DMOS device, which comprises the steps of sequentially forming a first oxide layer, a nitride layer and a second oxide layer on said semiconductor substrate and forming a photoresist pattern on said second oxide layer to define a trench forming region; subjecting said semiconductor substrate having said layers to an etching process by using said photoresist pattern as a trench forming mask so as to sequentially remove said layers and a portion of said semiconductor substrate; a thermal oxidation process after removing said second oxide layer so as to form a third oxide layer, thicker than said first oxide layer, on said sidewalls and bottom of said trench; forming a polysilicon layer over said nitride layer together with filling said trench; subjecting said semiconductor substrate to a polishing process so as to expose a top surface of said first oxide layer; wet-etching said third oxide layer between said polysilicon layer and said sidewalls from the top of said trench to a point surpassing the bottom of said polysilicon layer, said third oxide layer comprising a bottom part having a thickness greater than sidewall parts thereof, and said bottom part comprising a central region having a thickness greater than boundary regions thereof; and subjecting, after removal of said polysilicon layer, said semiconductor substrate to a thermal oxidation process to form a relatively thin oxide layer to said third oxide layer on said sidewalls of said trench, said third oxide layer and said relatively thin oxide layer constituting a gate oxide layer.

The trench DMOS device, which is fabricated in accordance with the inventive method, has the bottom part of the gate oxide layer formed relatively thick compared to the sidewall parts thereof, and also the central region of the bottom part formed relatively thick compared with the boundary regions thereof, so that the breakdown may be sufficiently prevented from occurring in the central region.

BRIEF DESCRIPTION OF THE DRAWINGS

This invention may be better understood and its object will become apparent to those skilled in the art by reference to the accompanying drawings as follows.

DETAILED DESCRIPTION OF THE PREFERRED EMBODIMENTS

Figure 4A:
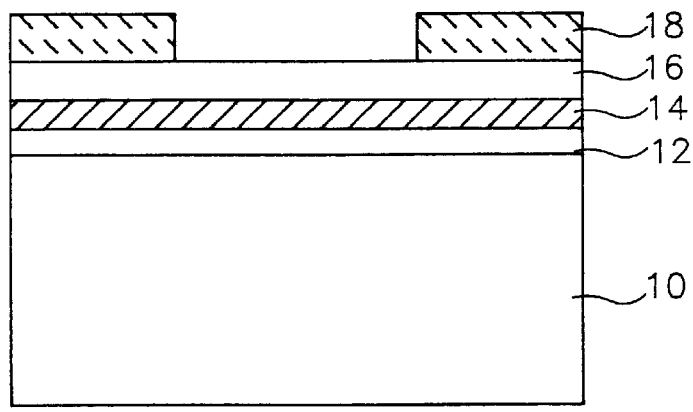
FIGS. 4A to 4H are flow diagrams illustrating sequential cross-sectional representations the process steps of a novel method for fabricating a trench DMOS transistor in accordance with the present invention.
Figure 4B:
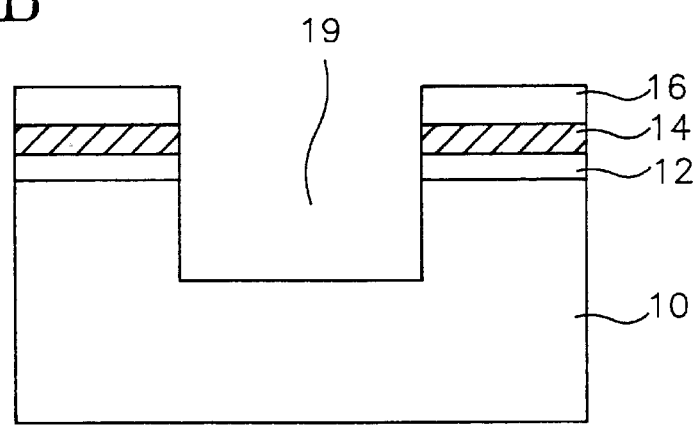
Figure 4C:
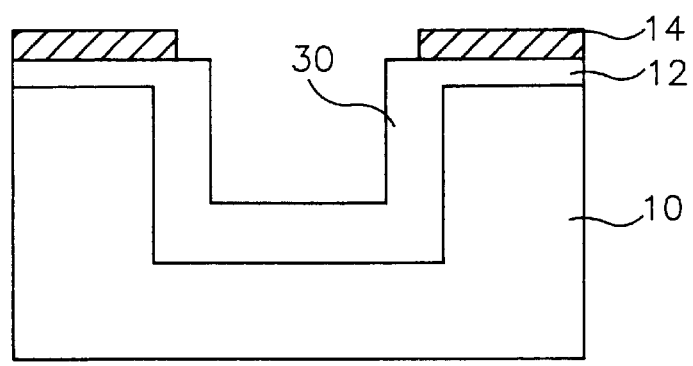
Figure 4D:
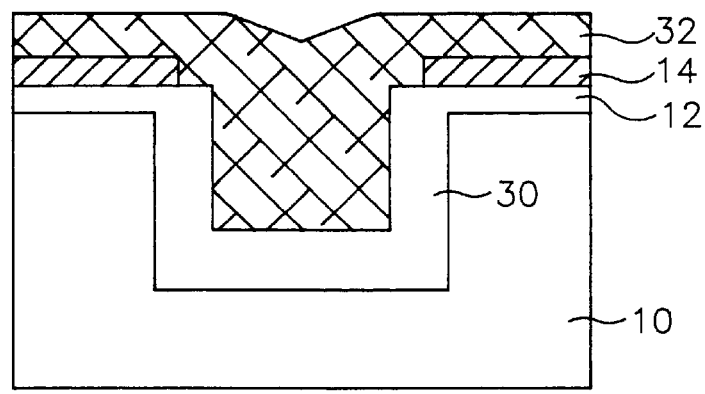
Figure 4E:
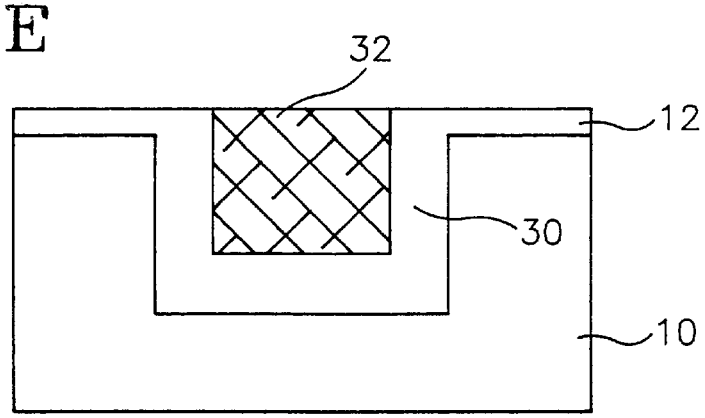
Figure 4F:
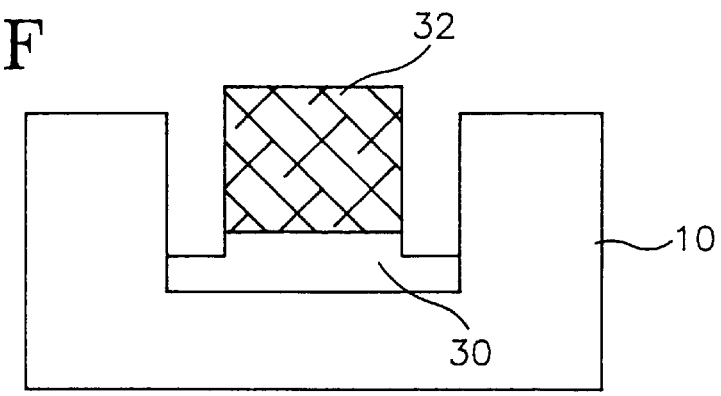
Figure 4G:
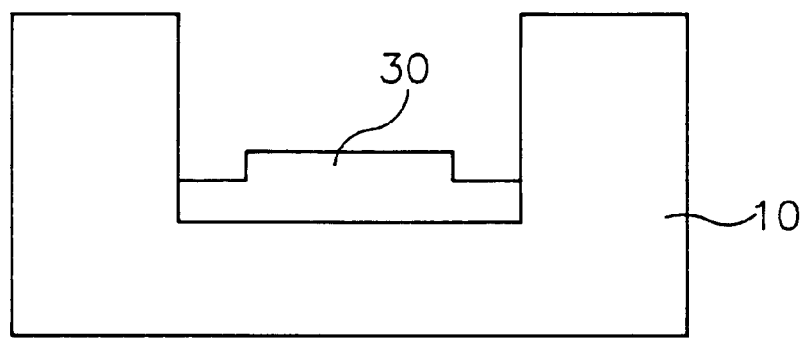
Figure 4H:
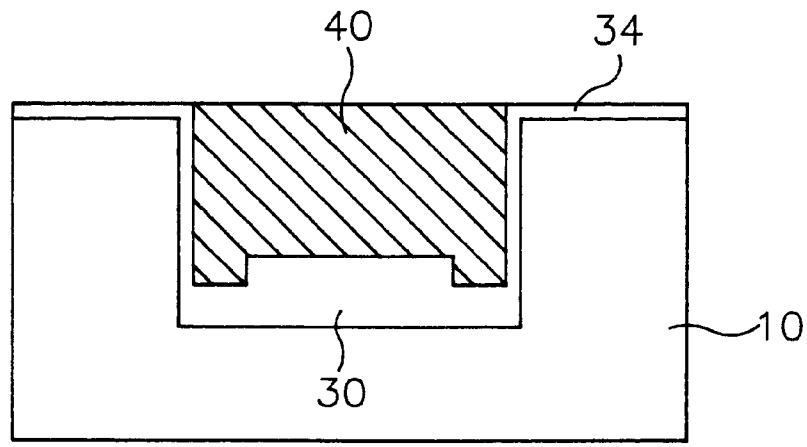

Referring to FIG. 4H, a novel trench DMOS device in accordance with this invention comprises a trench containing a gate polysilicon layer 40, and a gate oxide layer 34 formed between the polysilicon layer 40 and the sidewalls and bottom of the trench. The bottom part of the gate oxide layer 34 has a thickness greater than that of the sidewall parts thereof, and the central region of the bottom part 30 is flattened with a thickness greater than that of the boundary regions thereof.

The inventive trench DMOS device may be fabricated in the manner as shown in FIGS. 4A to 4H, although other equivalent methods may be used to fabricate this novel device. Referring to FIG. 4A, a first oxide layer 12, a nitride layer 14, and a second oxide layer 16 are sequentially formed on a semiconductor substrate 10. A patterned photoresist 18 is formed on the second oxide layer 16 by means of a well-known photo technique to define a trench forming region.

As shown in FIG. 4B, the semiconductor substrate is subjected to an etching process by using the patterned photoresist 18 as a trench forming mask so as to sequentially remove the layers 16, 14, 12 and a portion of the substrate 10 to form a trench 19. The trench 19 is formed by removing a portion, but not all, of the semiconductor substrate 10.

As shown in FIG. 4C, the semiconductor substrate is subjected to a thermal oxidation process after removing the second oxide layer 16, so that the bottom and sidewalls of the trench 19 are oxidized to form a thick thermal oxide layer 30. A polysilicon layer 32 is deposited in the trench 19 and over the nitride layer 14, as shown in FIG. 4D, although another suitable fill material may be used in place of the polysilicon layer 32. A polishing process is carried out until the top surface of the first oxide layer 12 is exposed, as shown in FIG. 4E. The thick thermal oxide layer 30 is wet-etched between the polysilicon layer 32 and the trench sidewalls to a point below the bottom of polysilicon layer 32, as shown in FIG. 4F. After removing the residual polysilicon layer 32 as shown in FIG. 4G, a thermal oxidation process is carried out to oxidize the sidewalls of the trench 19 on the surface of the semiconductor substrate, thereby growing a thin oxide layer 34, as shown in FIG. 4H. The thin oxide layer 34 is in contact with the thick thermal oxide layer 30, thereby forming the gate oxide layer. In FIG. 4H, it can be seen that the gate polysilicon 40 is deposited after the thin oxide layer 34 is grown.

Figure 1:
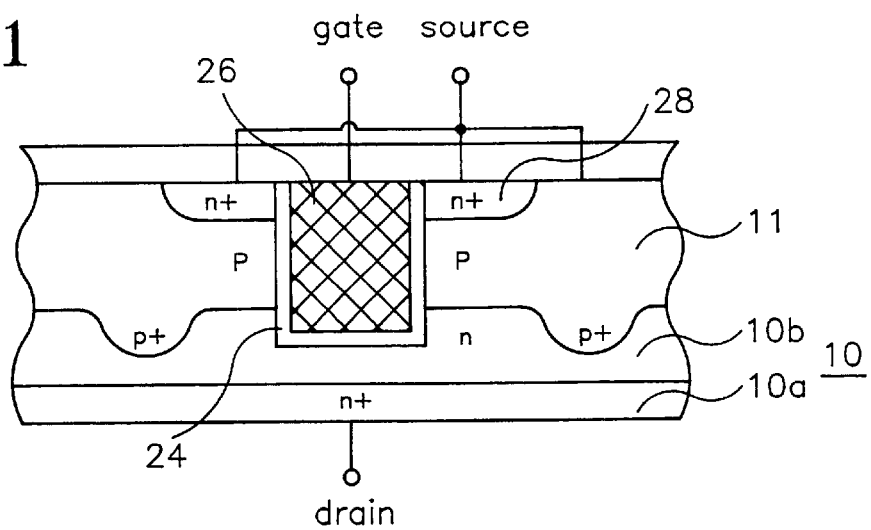
FIG. 1 is a cross sectional view showing the structure of a conventional trench DMOS transistor.
Figure 2A:
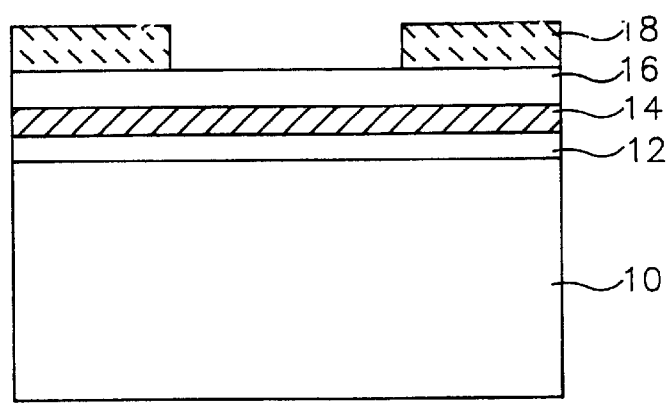
FIGS. 2A to 2D are flow diagrams illustrating sequential cross-sectional representations of the process steps of a conventional method for fabricating the trench DMOS transistor shown in FIG. 1.
Figure 2B:
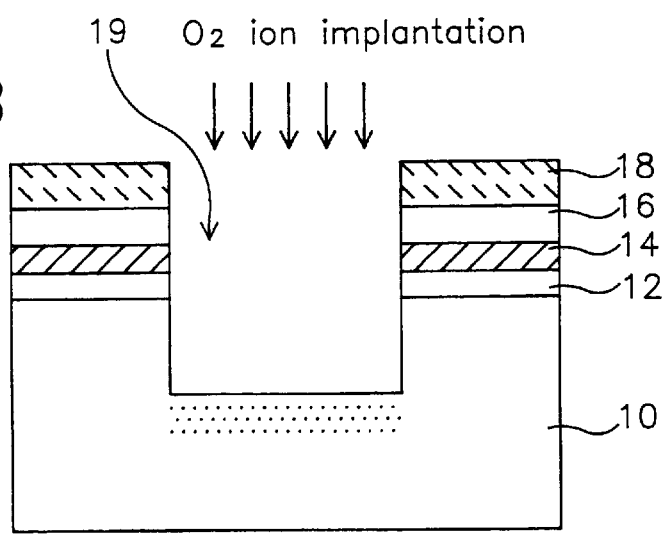
Figure 2C:
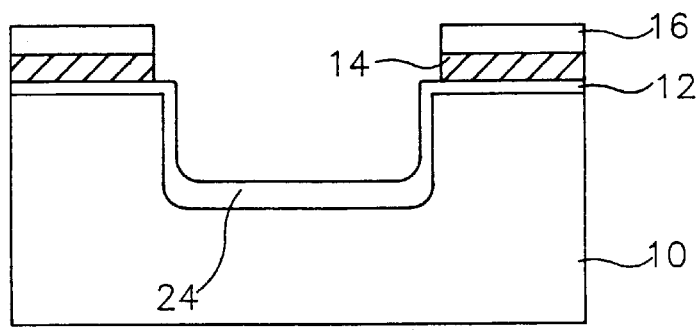
Figure 2D:
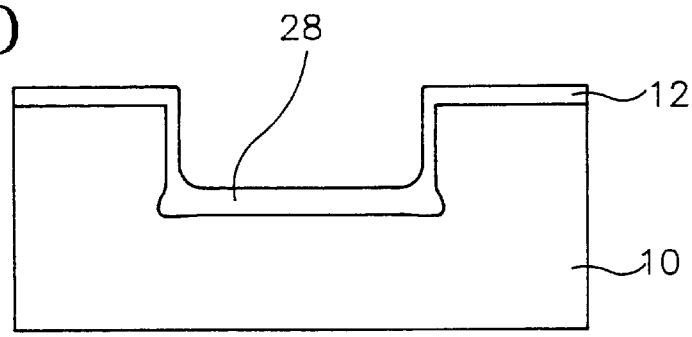
Figure 3A:
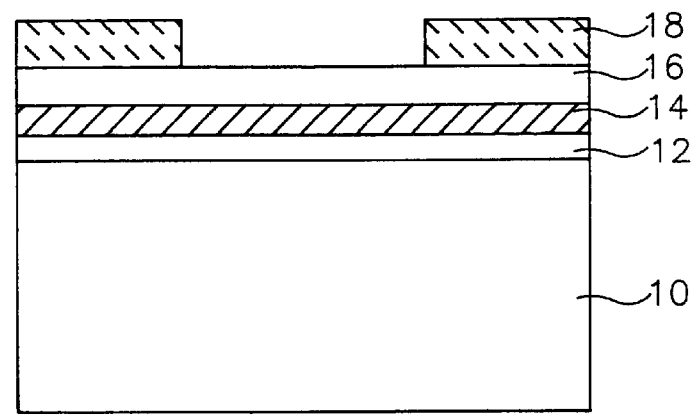
FIGS. 3A to 3F are flow diagrams illustrating sequential cross-sectional representations of the process steps of another conventional method for fabricating the trench DMOS transistor shown in FIG. 1.
Figure 3B:
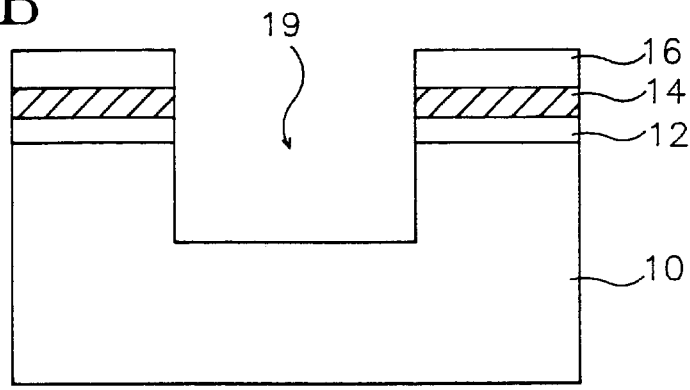
Figure 3C:
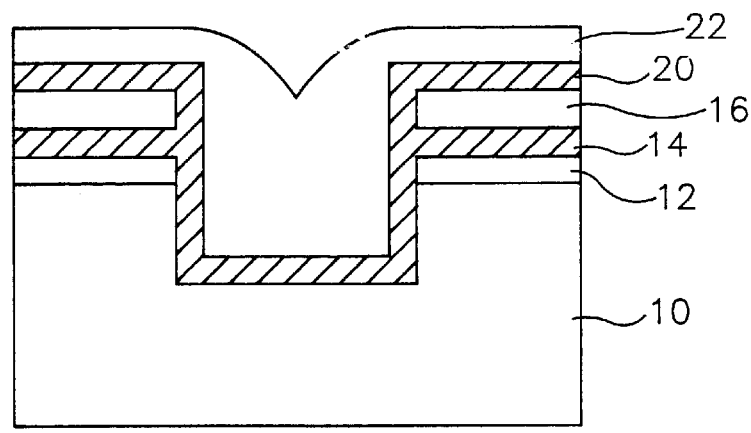
Figure 3D:
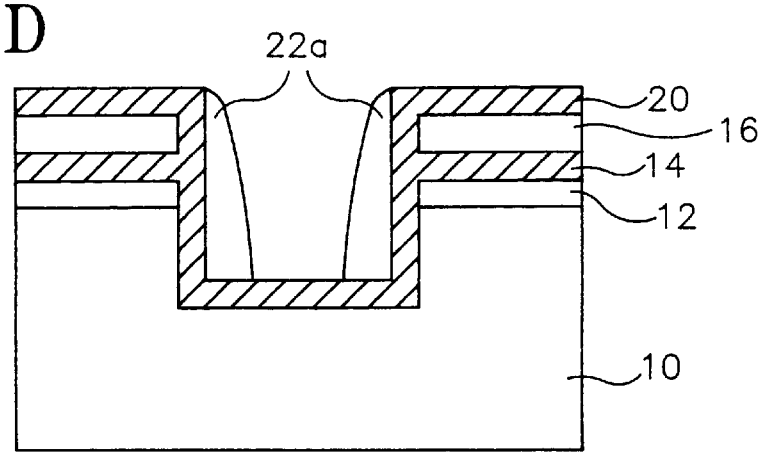
Figure 3E:
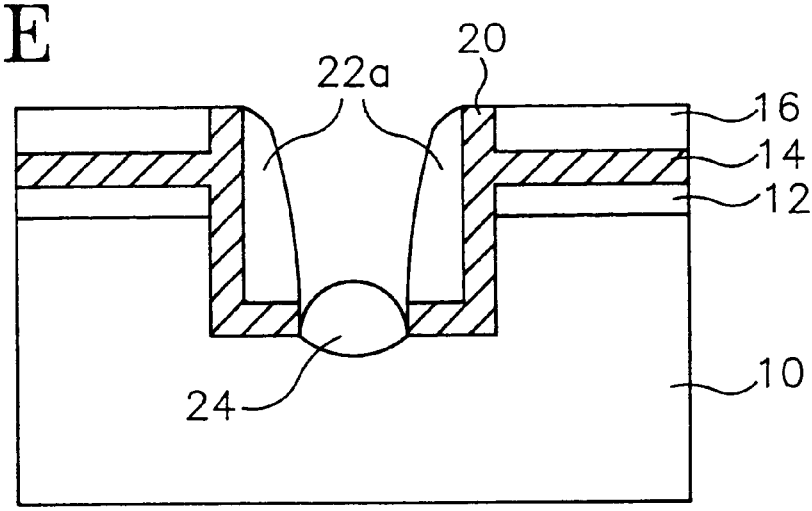
Figure 3F:
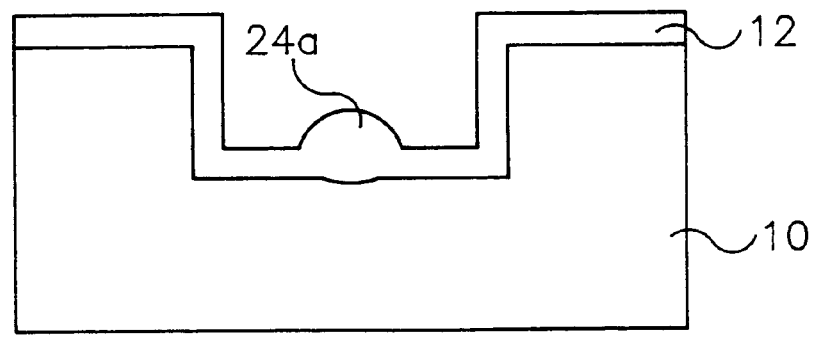

The novel method and structure disclosed above refers to the trench and gate oxide regions of a trench DMOS device. Well-known fabrication methods may be used to form the source, drain, and other semiconductor regions of a functioning trench DMOS device, as shown in FIG. 1. In addition to trench DMOS devices, this method and structure may be utilized for other trench semiconductor devices.

As described above, the bottom part 30 of the gate oxide layer has a thickness greater than the sidewall parts, and the central region of the bottom part 30 is formed relatively flat with a thickness greater than that of the boundary regions thereof, so that breakdown may be prevented from occurring in the central region. Therefore, the DMOS device has greatly improved breakdown characteristics. Moreover, this embodiment of the inventive method avoids the steps of forming the sidewall spacers and dry-etching, so that the fabrication process is simplified. This embodiment of the inventive method prevents the degradation of the device silicon interface characteristics caused by the dry etching process, although this invention encompasses equivalent methods used to achieve the same result.

What is claimed is:

1. A trench semiconductor device, comprising:
   a trench formed in a semiconductor substrate, said trench having sidewalls, a bottom, and bottom corners where the sidewalls and bottom merge;
   a gate polysilicon layer substantially filled into said trench; and
   a gate oxide layer formed between said gate polysilicon layer and said sidewalls, said bottom and said bottom corners of said trench, said gate oxide layer having a first portion on said sidewalls and a second portion on said bottom, said second portion being thicker than said first portion and comprising a central region bounded by boundary regions, wherein said central region is raised step-wise at angles of approximately ninety degrees from said boundary regions and has a substantially flattened top surface, and wherein the transitions between steps of said central and said boundary regions are substantially planar.

2. The trench semiconductor device as in claim 1, wherein said first portion contacts said second portion only in said boundary region without contacting said central region.

3. The trench device of claim 1, wherein said boundary region has a substantially flat surface.

4. A trench semiconductor device, comprising:
   a semiconductor substrate having a trench formed therein, said trench having sidewalls, a bottom, and bottom corners where the sidewall and bottom merge;
   a gate oxide layer disposed on said sidewalls, said bottom and said bottom corners of said trench, said gate oxide layer having a sidewall portion on said sidewalls of said trench, a bottom portion on said bottom of said trench, the bottom portion being thicker than the sidewall portion, and a bottom corner portion on said bottom corners of said trench; and
   a gate layer substantially filled into said trench with said gate oxide layer being between the gate layer and said semiconductor substrate, wherein said bottom portion of said gate oxide layer includes a central region bounded by boundary regions, said central region being thicker than said boundary region, raised step-wise at angles of approximately ninety degrees from said boundary regions, and having a substantially flat top surface and wherein the transitions between steps of said central and said boundary regions are substantially planar.

5. The trench device of claim 4, wherein said sidewall portion contacts said bottom portion only in said boundary region without contacting said central region.

6. The trench device of claim 4, wherein said boundary region has a substantially flat surface.

7. A trench semiconductor device, comprising:
   a trench formed in a semiconductor substrate, the trench having sidewalls, a bottom and corners where the sidewalls and bottom merge;
   a conductive gate material substantially filling the trench; and
   a gate dielectric layer formed between the conductive gate material and both the trench bottom and the trench sidewalls, the gate dielectric material at the bottom of the trench being thicker than the gate dielectric material along the sidewalls and including a flat-topped protrusion centered and extending along the bottom of the trench in a direction substantially parallel to the sidewalls of the trench, the flat-topped protrusion having edges that are substantially planar from the top of the protrusion to the bottom and that are laterally spaced from the sidewalls of the trench and that are substantially perpendicular to the top of the protrusion.

8. The trench device of claim 7, wherein the gate dielectric layer between a sidewall of the trench and an edge of the protrusion has a substantially flat surface.

* * * * *

UNITED STATES PATENT AND TRADEMARK OFFICE
CERTIFICATE OF CORRECTION

PATENT NO.     : 6,489,652 B1
DATED          : December 3, 2002
INVENTOR(S)    : Jeon et al.

It is certified that error appears in the above-identified patent and that said Letters Patent is hereby corrected as shown below:

<u>Title page,</u>
Item [73], the assignee should read:

-- Fairchild Korea Semiconductor Ltd., Puchon-City, Republic of Korea --

Signed and Sealed this

Twentieth Day of May, 2003

JAMES E. ROGAN
*Director of the United States Patent and Trademark Office*